United States Patent
Cheng et al.

(10) Patent No.: US 11,965,237 B2
(45) Date of Patent: Apr. 23, 2024

(54) SYSTEM AND METHOD FOR DETECTING ABNORMALITY OF THIN-FILM DEPOSITION PROCESS

(71) Applicant: Taiwan Semiconductor Manufacturing Company, Ltd., Hsinchu (TW)

(72) Inventors: Wen-Hao Cheng, Taichung (TW); Hsuan-Chih Chu, Changhua County (TW); Yen-Yu Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 582 days.

(21) Appl. No.: 17/096,962

(22) Filed: Nov. 13, 2020

(65) Prior Publication Data
US 2022/0154330 A1    May 19, 2022

(51) Int. Cl.
*C23C 14/52* (2006.01)
*C23C 14/34* (2006.01)
*C23C 14/54* (2006.01)
*H01J 37/32* (2006.01)
*H01J 37/34* (2006.01)

(52) U.S. Cl.
CPC .............. *C23C 14/52* (2013.01); *C23C 14/34* (2013.01); *C23C 14/54* (2013.01); *H01J 37/32926* (2013.01); *H01J 37/3447* (2013.01); *H01J 37/347* (2013.01); *H01J 37/3482* (2013.01)

(58) Field of Classification Search
None
See application file for complete search history.

(56) References Cited

U.S. PATENT DOCUMENTS

| | | | | |
|---|---|---|---|---|
| 4,983,269 A | * | 1/1991 | Wegmann | C23C 14/3407 204/298.03 |
| 5,126,028 A | * | 6/1992 | Hurwitt | H01J 37/3452 204/298.18 |
| 5,478,455 A | * | 12/1995 | Actor | C23C 14/34 204/298.11 |
| 6,036,821 A | * | 3/2000 | Warren | H01J 37/3447 204/298.11 |
| 6,497,797 B1 | * | 12/2002 | Kim | C23C 14/3407 204/192.12 |
| 6,811,657 B2 | * | 11/2004 | Jaso | C23C 14/543 204/298.03 |
| 2002/0027429 A1 | * | 3/2002 | Sandhu | C23C 14/046 216/61 |
| 2005/0211549 A1 | * | 9/2005 | Chang | C23C 14/3407 204/298.03 |

(Continued)

*Primary Examiner* — Binu Thomas
(74) *Attorney, Agent, or Firm* — JCIPRNET

(57) ABSTRACT

A system and a method for detecting abnormality of a thin-film deposition process are provided. In the method, a thin-film is deposited on a substrate in a thin-film deposition chamber by using a target, a dimension of a collimator mounted between the target and the substrate is scanned by using at least one sensor disposed in the thin-film deposition chamber to derive an erosion profile of the target, and abnormality of the thin-film deposition process is detected by analyzing the erosion profile with an analysis model trained with data of a plurality of erosion profiles derived under a plurality of deposition conditions.

20 Claims, 7 Drawing Sheets

(56) References Cited

U.S. PATENT DOCUMENTS

| | | | |
|---|---|---|---|
| 2006/0081459 A1* | 4/2006 | Tsai | C23C 14/35 204/298.03 |
| 2018/0265964 A1* | 9/2018 | Kato | C23C 14/34 |
| 2022/0019863 A1* | 1/2022 | Iskandar | G06F 18/2413 |

* cited by examiner

SYSTEM AND METHOD FOR DETECTING ABNORMALITY OF THIN-FILM DEPOSITION PROCESS

BACKGROUND

In a physical vapor deposition (PVD) process, a target is bombarded with plasma of inert gas such as argon and material are sputtered off from the target and deposited onto a substrate such as a silicon wafer. In the PVD chamber, a collimator is mounted between the target and the substrate to increase directionality of sputtered material and accordingly improve coating uniformity of the substrate.

BRIEF DESCRIPTION OF THE DRAWINGS

Aspects of the present disclosure are best understood from the following detailed description when read with the accompanying FIG.s. It is noted that, in accordance with the standard practice in the industry, various features are not drawn to scale. In fact, the dimensions of the various features may be arbitrarily increased or reduced for clarity of discussion.

DESCRIPTION OF EMBODIMENTS

Figure 1:
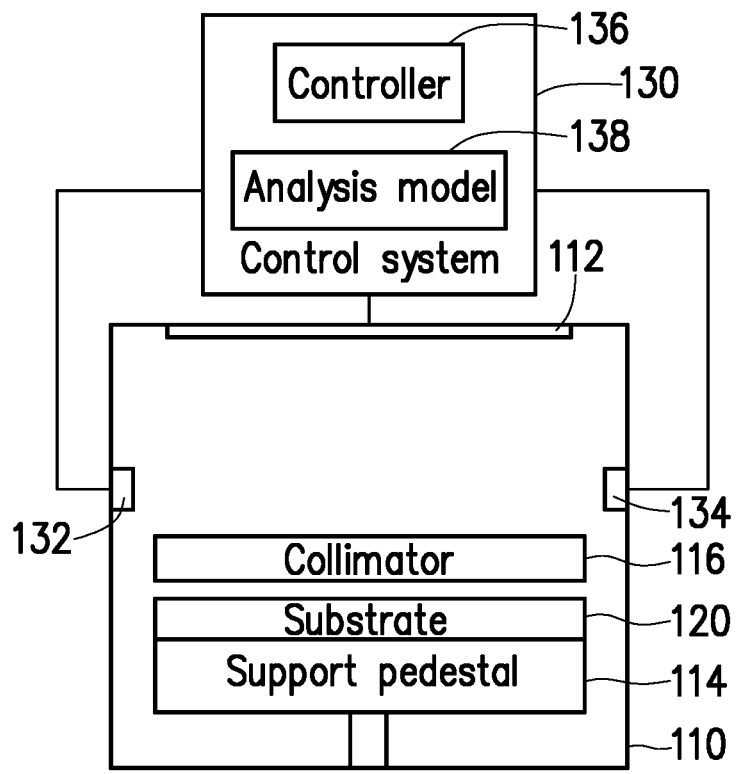
FIG. 1 is a schematic diagram of a thin-film deposition system 100 according to one embodiment.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

In the following description, many thicknesses and material are described for various layers and structures within an integrated circuit die. Specific dimensions and material are given by way of example for various embodiments. Those of skill in the art will recognize, in light of the present disclosure, that other dimensions and material can be used in many cases without departing from the scope of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a system and a method for detecting abnormality of a target in a thin-film deposition chamber. As a collimator acts as a barrier to the passage of material sputtered from a target in a thin-film deposition process, the sputtered material is accumulatively deposited on a wall of the collimator along with progress of the deposition process, and erosion status of the target can be derived based on a dimension of the collimator. Accordingly, in the embodiments of the present disclosure, various sensors are disposed in a thin-film disposition chamber to, after the deposition process, scan the dimension of the collimator, so as to derive an erosion profile of the target. Embodiments of the present disclosure further utilize machine learning technique to learn the erosion profiles obtained under various deposition conditions so as to detect the abnormality of the thin-film deposition process. The abnormality detection can be set as a part of a recipe of a wafer and performed at swapping intervals of the wafer, thereby enabling cessation of the thin-film deposition processes immediately after a defective deposition process. As a result, rather than having a large number of wafers receiving defective thin-films, the defective deposition process can be detected in advance to prevent additional wafers from being affected.

FIG. 1 is a schematic diagram of a thin-film deposition system 100 according to one embodiment. Referring to FIG. 1, the thin-film deposition system 100 includes a thin-film deposition chamber 110 that defines an inner process volume for a thin-film deposition process, and a control system 130 that controls the operation of the thin-film deposition system 100. The thin-film deposition chamber 110 at least includes a target 112, a support pedestal 114, and a collimator 116.

The target 112 comprises material to be deposited onto a surface of a substrate 120 loaded by the support pedestal 114 during sputtering. In some embodiments, the target 112 may include copper to be deposited as a seed layer in high aspect ratio features formed in the substrate 120. In some embodiments, the target 112 may also include a bonded composite of a metallic surface layer of sputterable material such as copper, and a backing layer of a structural material such as aluminum.

The support pedestal 114 is mounted opposite to the target 112 and configured to load the substrate 120 such as a wafer. In some implementations, the support pedestal 114 supports the substrate 120 to be sputter coated, a surface thereof are in a plane opposite to a principal surface of the target 112. The support pedestal 114 has a planar substrate-receiving surface disposed generally parallel to a sputtering surface of the target 112. The support pedestal 114 may be vertically movable through a bellows (not shown) to allow the substrate 120 to be transferred onto the support pedestal 114 through a load lock valve (not shown) in a lower portion of the thin-film deposition chamber 110. The support pedestal 114 may then be raised to a deposition position as shown in FIG. 1.

The collimator 116 is comprised of a material selected from aluminum, copper, and stainless steel and mounted between the target 112 and the substrate 120. The collimator 116 has a uniform thickness and includes a number of passages formed through the thickness. The material sputtered from the target 112 passes through the collimator 116 on its path from the target 112 to the substrate 120. The collimator 116 filters out or collects material that would otherwise strike the wall at acute angles exceeding a desired angle. The sputtered material traveling on a path approaching normal to the substrate 120 passes through the collimator 116 and are deposited on the substrate 120, which allows improved coating uniformity of the substrate 120.

Figure 2:
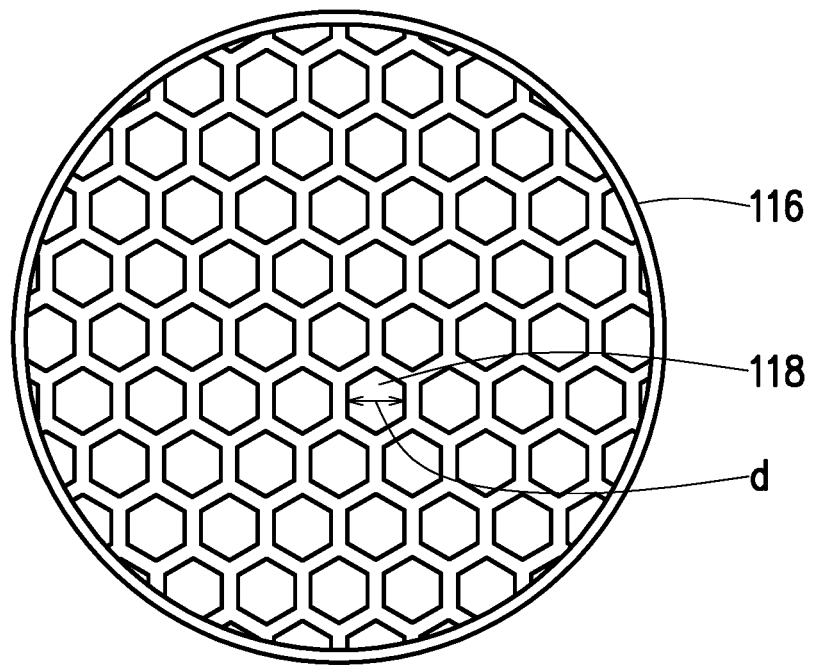
FIG. 2 is a schematic diagram illustrating a structure of the collimator 116 according to one embodiment.

FIG. 2 is a schematic diagram illustrating a structure of the collimator 116 according to one embodiment. Referring to FIG. 2, the collimator 116 is designed with a honeycomb structure having walls defining and separating hexagonal apertures 118 (having a width d) in a close-packed arrangement. The honeycomb structure of the collimator 116 may serve as an integrated flux optimizer to improve the flow path, ion fraction, and ion trajectory behavior of the material passing through the collimator 116.

The thin-film deposition system 100 is configured for performing one or more of physical vapor deposition (PVD) processes, chemical vapor deposition (CVD) processes, atomic layer deposition (ALD) processes, or other types of thin-film deposition processes for forming a thin-film on the substrate 120.

In some embodiments, the thin-film deposition process is a titanium nitride deposition process. In this case, the target 112 is a titanium sputtering target. After the process volume of the thin-film deposition chamber 110 is evacuated, nitrogen serving as the precursor gas is flowed into the process volume. A high bias potential is supplied to the thin-film deposition chamber 110 to ionize the precursor gas and generate plasma. Then, the target 112 is bombarded with the plasma, and the material sputtered from the target 112 due to the bombardment is deposited onto the substrate 120 through the collimator 116. As the sputtered material passing through the collimator 116, a part of the material is deposited on the wall of the collimator 116, and a dimension (e.g. a diameter of an opening or wall thicknesses) of the hexagonal apertures as shown in FIG. 2 is changed. The dimension change of the hexagonal apertures in the collimator 116 may reflect the erosion amount or status of the target 112 and used to derive the erosion profile of the target 112.

The control system 130 may be configured to detect the abnormality of the thin-film deposition process. The control system 130 may include two sensors 132 and 134 disposed on opposite walls of the thin-film deposition chamber 110 around the collimator 116, and a controller 136 coupled to the sensors 132 and 134. The controller 136 is, for example, a central processing unit (CPU), or other programmable general-purpose or specific-purpose microprocessor, microcontroller (MCU), programmable controller, application specific integrated circuits (ASIC), programmable logic device (PLD) or other similar devices or a combination of these devices; the embodiment provides no limitation thereto.

In some embodiments, the controller 116 may control the sensors 132 and 134 to scan the dimension of the collimator 116 after the thin-film deposition process. In some embodiments, the controller 136 may control the sensors 132 and 134 to rotate around the collimator 116 so as to scan a dimension of the collimator 116, especially a dimension of each of a plurality of comb structures of the collimator 116, after the thin-film deposition process.

The controller 136 may derive an erosion profile of the target 112 from the dimension of the collimator 116 scanned by the sensors 132 and 134, and accordingly detect abnormality of the thin-film deposition process by analyzing the erosion profile with an analysis model 138.

In some embodiments, the abnormality of the thin-film deposition process may occur due to contaminants or impurities in a target material, a precursor material, or other material introduced into the thin-film deposition chamber 110 during the thin-film deposition process. In some embodiments, the thin-film deposition process is performed in vacuum conditions, and the abnormality of the thin-film deposition process may occur due to an air leak or another flaw in equipment that may allow outside air to enter into the thin-film deposition chamber 110 and oxidize the thin-film. As a result, the thin-film may not have the intended structure, composition, and characteristics to perform a selected function on the substrate 120.

In some embodiments, the analysis model 138 is trained with data of a plurality of erosion profiles derived under a plurality of deposition conditions through a machine learning process, and is used for analyzing the erosion profile of the target 112 currently derived, so as to detect abnormality of the thin-film deposition process. The analysis model 138 may be a neural network model or another type of machine learning model, which is not limited herein. As is set forth in more detail with regards to FIGS. 5 and 6, the analysis model 138 is trained with a training set that includes a plurality of erosion profiles associated with normal or abnormal thin-film deposition processes. The machine learning process utilizes the training set to train the analysis model 138 to reliably detect abnormality of the thin-film deposition process from the erosion profile of the target 112 currently derived.

When the abnormality of the thin-film deposition process is detected, the controller 136 may take various responsive actions. In some embodiments, the controller 136 can cause the thin-film deposition system 100 to stop operating, or output information indicating the abnormality. In some embodiments, the controller 136 may identify the abnormal portion of the erosion profile, and may further derive the causes of the abnormality.

Although FIG. 1 illustrates two sensors 132 and 134 disposed on opposite walls of the thin-film deposition chamber 110 around the collimator 116, in some embodiments, thin-film deposition system 100 may utilize only one sensor disposed on the wall of the thin-film deposition chamber 110 to scan the dimension of the collimator 116, or further utilize a robot to carry the sensor to scan the dimension of the collimator 116.

Figure 3:
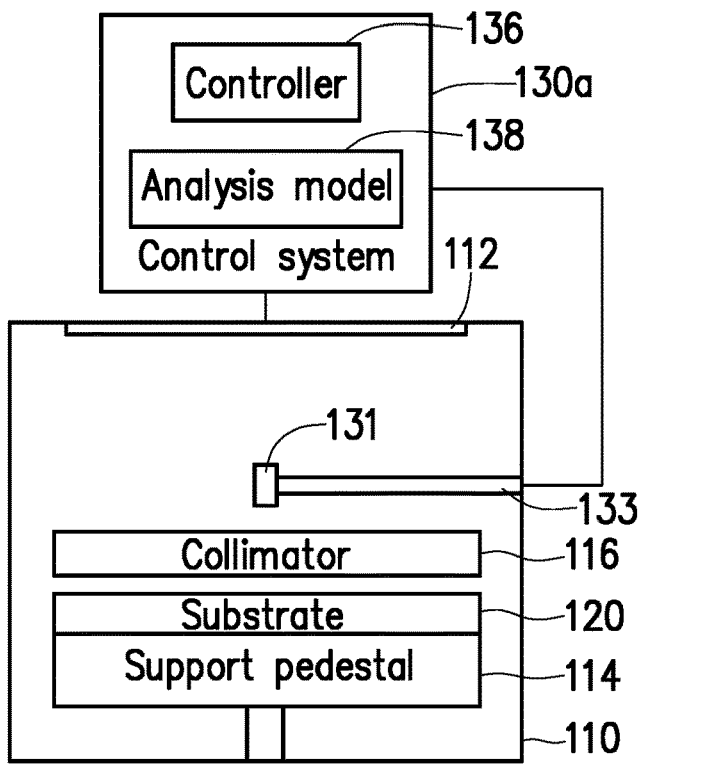
FIG. 3 is a schematic of a thin-film deposition system 100a according to one embodiment.

For example, FIG. 3 is a schematic of a thin-film deposition system 100a according to one embodiment. The thin-film deposition system 100a differs from the thin-film deposition system 100 in FIG. 1 on the disposition of the sensors. In the thin-film deposition system 100a, a sensor 131 is disposed on a robot 133 that can extend above the collimator 116, and the controller 136 of a control system 130a may control the robot 133 carrying the sensor 131 to extend above the collimator 116, so as to scan the dimension of the collimator 116.

Figure 4:
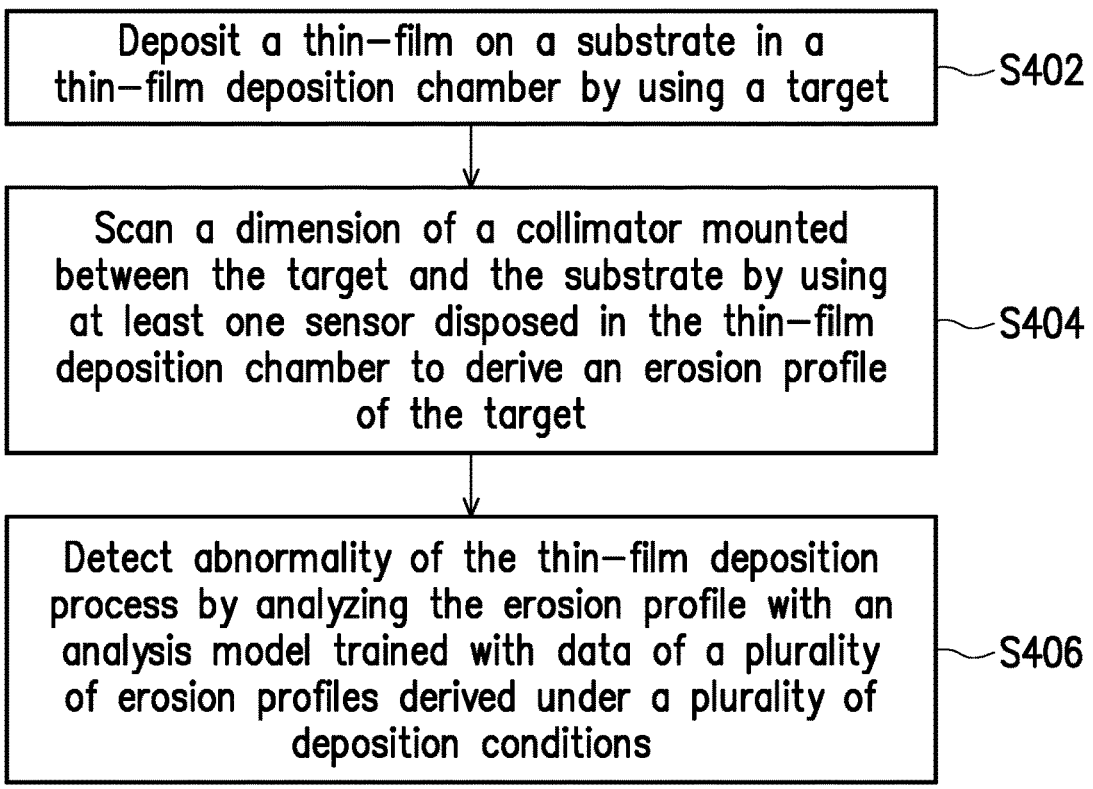
FIG. 4 is a flowchart illustrating a method for detecting abnormality of a thin-film deposition process according to one embodiment.

FIG. 4 is a flowchart illustrating a method for detecting abnormality of a thin-film deposition process according to one embodiment. Referring to FIG. 1 and FIG. 4, the method of the present embodiment can be implemented by the above-mentioned control system 130, and the detailed steps of the method will be described below with reference to various devices and components of the control system 130.

In step S402, the controller 136 of the control system 130 controls the thin-film deposition chamber 110 to deposit a thin-film on the substrate 120 by using the target 112. In step S404, the controller 136 controls the sensors 132 and 134 to scanning a dimension of the collimator 116 mounted between the target 112 and the substrate 120 to derive an erosion profile of the target 112.

In some embodiments, the sensors 132 and 134 include a light detection and ranging (Lidar) sensor or a sound navigation and ranging (Sonar) sensor. Accordingly, the controller 136 may control the sensors 132 and 134 to emit a plurality of signal pulses to the collimator 116 at regular intervals and then detect a plurality of reflected signal from the collimator 116 as the erosion profile of the target 112.

In some embodiments, the sensors 132 and 134 include an image sensor such as a charge-coupled device (CCD), a complementary metal-oxide semiconductor (CMOS) device, or other types of photosensitive devices. Accordingly, the controller 136 may control the sensors 132 and 134 to capture images of the collimator 116 and identify a plurality of features in the captured images as the erosion profile of the target 112. The features to be identified may include a diameter and asymmetry of each of a plurality of comb structures of the collimator, which are not limited thereto.

In step S406, the controller 136 detects abnormality of the thin-film deposition process by analyzing the erosion profile with the analysis model 138 trained with data of a plurality of erosion profiles derived under a plurality of deposition conditions.

Through aforesaid method, the control system 130 may know the erosion profile of the target 112 after each deposition process, instantly identify abnormal erosion profile and detect the abnormality of the deposition process, and accordingly performs suitable actions. As a result, defective deposition process can be early detected so as to prevent or reduce the impact of the defective deposition process on additional wafers.

In some embodiments, the control system 130 further includes components and functionality for establishing and training the analysis model 138 such that the analysis model 138 can be implemented by the controller 136 to detect abnormality of the thin-film deposition process.

Figure 5:
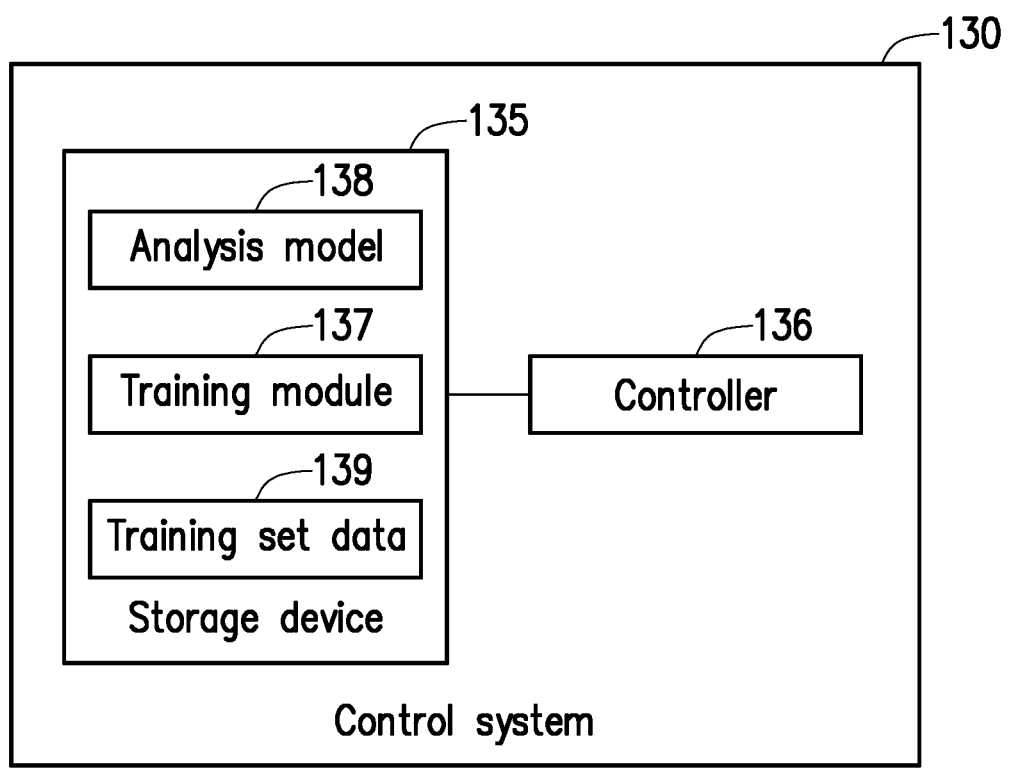
FIG. 5 is a block diagram of the control system 130 according to one embodiment.

FIG. 5 is a block diagram of the control system 130 according to one embodiment. In the present embodiments, the control system 130 is configured to control operation of a thin-film deposition system 100. However, in some embodiments, the control system 130 may be configured to only control the detection operation of abnormality of the thin-film deposition process, which is not limited to the present embodiment. The control system 130 utilizes machine learning to determine whether or not a thin-film deposition process is normal or abnormal, and further stop the thin-film deposition processes when the detection result is abnormal, before additional wafers are affected. The control system 130 can raise an alert indicating the abnormality of the thin-film deposition process.

In the present embodiment, the control system 130 further includes a storage device 135, which is, for example, any type of fixed or movable random access memory (RAM), read-only memory (ROM), flash memory, hard disk, similar devices, or a combination of the foregoing and is configured to store software instructions associated with the function of the control system 130 and its components, including, but not limited to, the analysis model 138 and a training module 137. The storage device 135 can store data associated with the function of the control system 130 and its components, including the training set data 139, current process data, and any other data associated with the operation of the control system 130.

The training module 137, as loaded and executed by the controller 136, trains the analysis model 138 with a machine learning process, so as to detect the abnormality of the thin-film deposition process based on the erosion profile of the target 112 currently derived. Although the training module 137 is shown as being separate from the analysis model 138, in practice, the training module 137 may be part of the analysis model 138.

The training set data 139 includes historical erosion profiles of the target 112 and data of the deposition conditions upon which the erosion profiles are derived. The historical erosion profiles of the target are derived based on the dimension of the collimator scanned under various deposition conditions, including, but not limited to, material and lifetime of the target 112, and a magnetic field and an electric filed applied to the thin-film deposition chamber 110 during the thin-film deposition process. The deposition conditions may include labels indicating normality or abnormality of the thin-film deposition process, or labels indicating causes of the abnormality determined after the thin-film deposition process, such as contaminants or impurities in a target material, a precursor material, or other material introduced into the thin-film deposition chamber 110 during the thin-film deposition process. As will be set forth in more detail below, the training module 137 utilizes the historical erosion profiles of the target 112 and the corresponding deposition conditions to train the analysis model 138 with a machine learning process.

In some embodiments, the analysis model 138 includes a neural network. Training of the analysis model 138 will be described in relation to a neural network. However, other types of analysis models or algorithms can be used without departing from the scope of the present disclosure. The training module 137 utilizes the training set data 139 to train the neural network with a machine learning process. During the training process, the neural network receives, as input, the erosion profiles of the target 112 and the deposition conditions from the training set data 139. During the training process, the neural network outputs a predicted condition. The predicted condition indicates, for each erosion profile provided to the analysis model 138, the category into which the erosion profile falls. The categories can include normality, abnormality, or various causes of the abnormality. The training process trains the neural network to generate predicted condition that matches the deposition conditions for each erosion profile.

In some embodiments, the neural network includes a plurality of neural layers. The various neural layers include neurons that define one or more internal functions. The internal functions are based on weighting values associated with neurons of each neural layer of the neural network. During training, the training module 137 compares, for each set of the historical erosion profile and the deposition conditions. The training module 137 generates an error function indicating how closely the predicted condition matches the deposition conditions. The training module 137 then adjusts the internal functions of the neural network. Because the neural network generates predicted condition based on the internal functions, adjusting the internal functions will result in the generation of different predicted condition for a same set of historical erosion profiles. Adjusting the internal functions can result in a predicted condition that produces larger error functions (worse matching to the deposition conditions) or smaller error functions (better matching to the deposition conditions).

After adjusting the internal functions of the neural network, the historical erosion profile is again passed to the neural network and the analysis model 138 again generates the predicted condition. The training module 137 again compares the predicted condition to the deposition conditions, and accordingly adjusts the internal functions of the neural network. This process is repeated in a very large number of iterations of monitoring the error functions and adjusting the internal functions of the neural network until a set of internal functions is found that results in a predicted condition that can match the deposition conditions across the entire training set.

At the beginning of the training process, the predicted condition likely will not match the deposition conditions. However, as the training process proceeds through many iterations of adjusting the internal functions of the neural network, the errors functions will trend smaller and smaller until a set of internal functions is found that results in predicted condition that matches the deposition conditions. When a set of internal functions is identified as causing the predicted condition matches the deposition conditions, the training process is completed. Once the training process is completed, the neural network is ready to be used to detect the abnormality of the thin-film deposition process.

Figure 6:
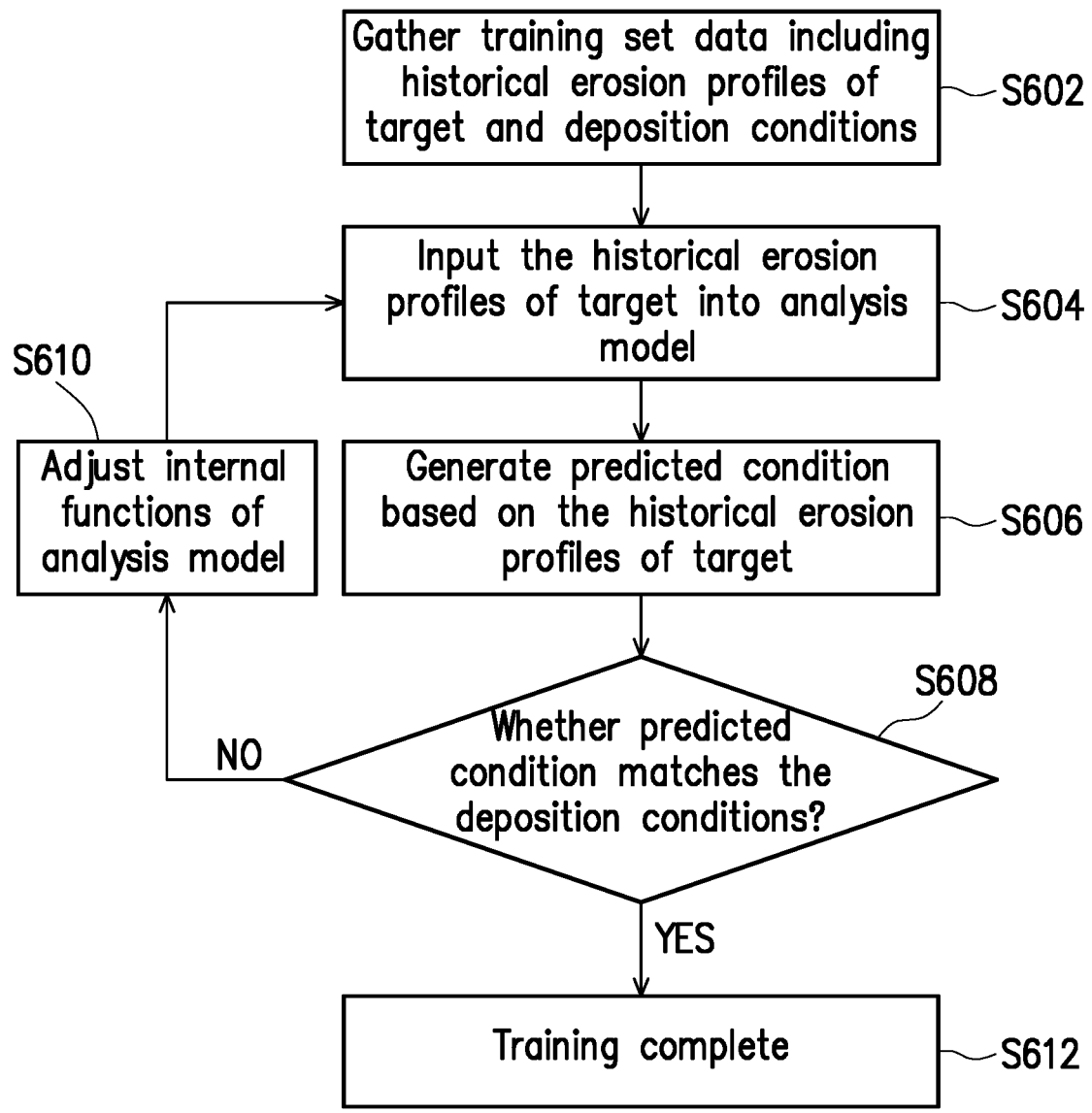
FIG. 6 is a flowchart illustrating a method for training an analysis model to detect the abnormality of the thin-film deposition process according to one embodiment.

FIG. 6 is a flowchart illustrating a method for training an analysis model to detect the abnormality of the thin-film deposition process according to one embodiment. Referring to FIG. 5 and FIG. 6, the method of the present embodiment can be implemented by the control system 130 in FIG. 5, and the detailed steps of the method will be described below with reference to various devices and components of the control system 130.

In step S602, the controller 136 executes the training module 137 to gather training set data 139 including historical erosion profiles of the target 112 and the corresponding deposition conditions. The gathering can be accomplished by using a data mining system or process. The data mining system or process can gather the training set data 139 by accessing one or more databases associated with the thin-film deposition system and collecting and organizing various types of data contained in the one or more databases. The data mining system or process, or another system or process, can process and format the collected data in order to generate the training set data 139.

In step S604, the controller 136 inputs the historical erosion profiles of the target 112 to the analysis model 138. In some embodiments, the controller 136 may further inputs the deposition conditions that may affect the deposition process, such as the material and lifetime of the target 112, and a magnetic field and an electric filed applied to the thin-film deposition chamber 110, to the analysis model 138. The historical erosion profiles and deposition conditions can be provided in consecutive discrete sets to the analysis model 138. Each discreet set can correspond to a single thin-film or groups of thin-film. The historical erosion profiles can be provided as vectors to the analysis model 138. Each set can include one or more vectors formatted for reception and processing by the analysis model 138. The historical erosion profiles can be provided to the analysis model 138 in other formats without departing from the scope of the present disclosure.

In step S606, the controller 136 generates a predicted condition based on the historical erosion profiles. In particular, the analysis model 138 generates, for each set of the historical erosion profiles, a predicted condition. The predicted condition corresponds to a prediction category of normality or abnormality of the thin-film deposition process, or the cause of the abnormality.

In step S608, the controller 136 compares the predicted condition with the historical deposition conditions, so as to determine whether the predicted condition matches the deposition conditions. In particular, the predicted condition for each set of historical erosion profile is compared to the deposition conditions associated with that set of historical erosion profile. The comparison can result in an error function indicating how closely the predicted condition matches the deposition conditions. This comparison is performed for each set of predicted condition. In some embodiments, this process can include generating an aggregated error function or an indication indicating how the totality of the predicted condition compares to the deposition conditions. These comparisons can be performed by the training module 137 or by the analysis model 138. The comparisons can include other types of functions or data than those described above without departing from the scope of the present disclosure.

If the aggregate error function is less than an error tolerance, then the controller 136 determines that the predicted condition does not match the deposition conditions. On the other hand, if the aggregate error function is greater than the error tolerance, then the controller 136 determines that the predicted condition does match the deposition conditions. In some embodiments, the error tolerance can include a tolerance between 0.1 and 0. In other words, if the aggregate percentage error is less than 0.1, or 10%, then the controller 136 considers that the predicted condition matches the deposition conditions. If the aggregate percentage error is greater than 0.1 or 10%, then the controller 136 considers that the predicted condition does not match the deposition conditions. Other tolerance ranges can be utilized without departing from the scope of the present disclosure. Error scores can be calculated in a variety of ways without departing from the scope of the present disclosure. The training module 137 or the analysis model 138 can make the determination associated with the step S608.

In some embodiments, if the predicted condition does not match the historical erosion profile at step S608, then the controller 136 proceeds to step S610. In step S610, the controller 136 adjusts the internal functions associated with the analysis model 138. In some embodiments, the training module 137 adjusts the internal functions associated with the analysis model 138. From step S610, the process returns to step S604. At step S604, the historical erosion profile is again provided to the analysis model 138. Because the internal functions of the analysis model 138 have been adjusted, the analysis model 138 will generate different predicted condition than in the previous cycle. The process proceeds to steps S606 and S608, and the aggregate error is calculated. If the predicted condition does not match the deposition conditions, then the process returns to step S610 and the internal functions of the analysis model 138 are adjusted again. This process proceeds in iterations until the analysis model 138 generates a predicted condition that matches the deposition conditions.

In some embodiments, if the predicted condition matches the deposition conditions in step S608, then the process proceeds to 5612. In step S612, the controller 136 determines the training is complete. The analysis model 138 is now ready to be utilized to identify the abnormality of the thin-film deposition processes performed by the thin-film deposition system 100. The process of FIG. 6 can include other steps or arrangements of steps than shown and described herein without departing from the scope of the present disclosure.

Figure 7A:
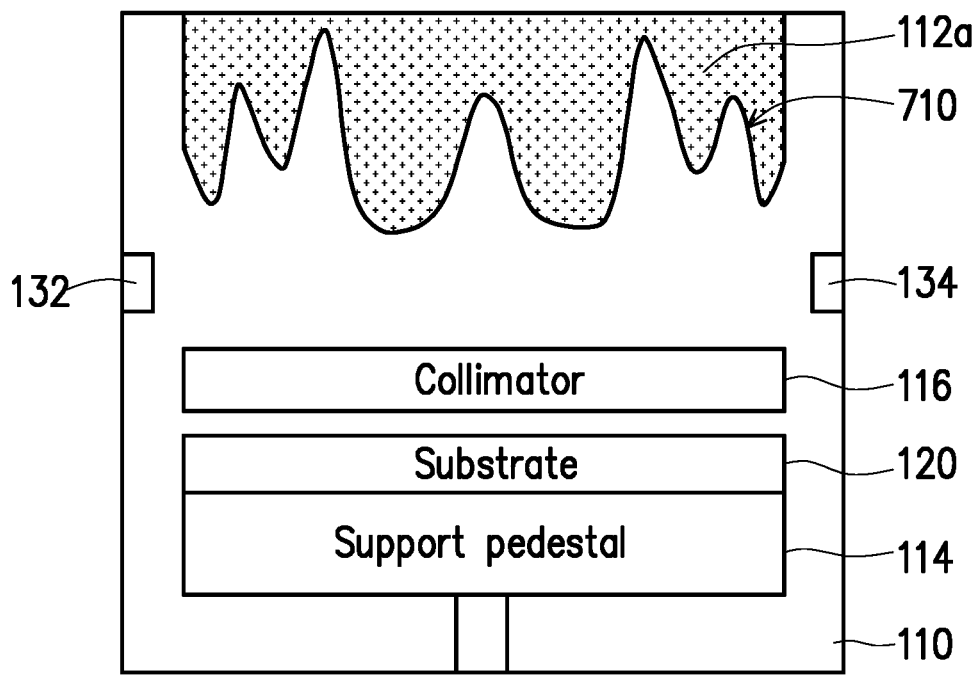
FIG. 7A and FIG. 7B are schematic diagrams illustrating the detection of abnormality of the thin-film deposition process according to one embodiment.
Figure 7B:
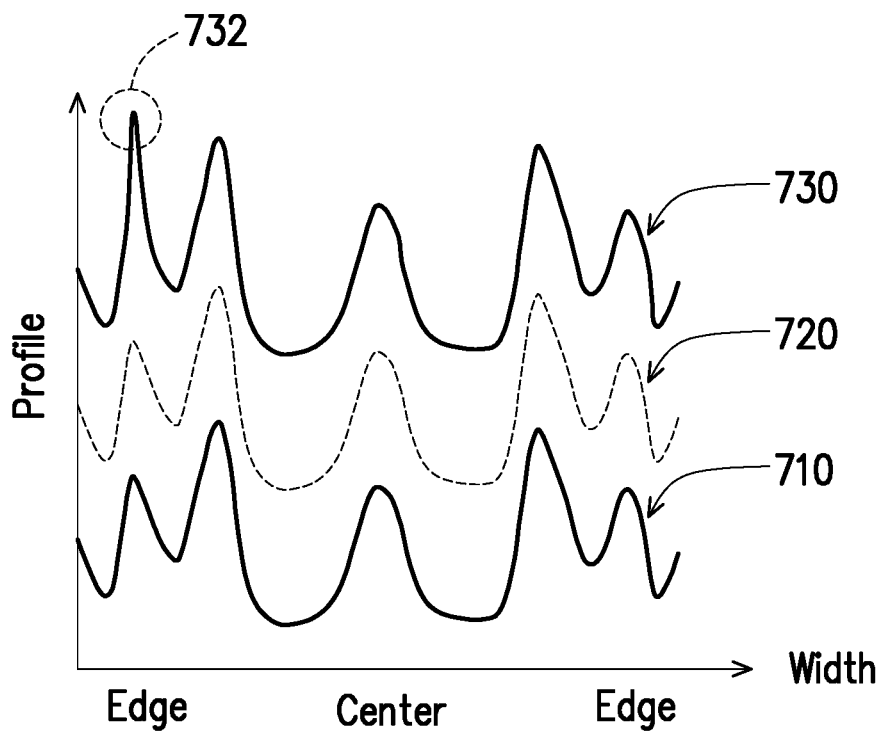

FIG. 7A and FIG. 7B are schematic diagrams illustrating the detection of abnormality of the thin-film deposition process according to one embodiment. The thin-film deposition chamber 110 in FIG. 7A has the same components and configurations as the thin-film deposition chamber 110 in FIG. 1 except for the target reminder 112a. In FIG. 7A, an erosion profile 710 of the target reminder 112a derived after the thin-film deposition process is emphatically illustrated. FIG. 7B illustrates comparison between erosion profiles of the target derived under different deposition conditions, in which the erosion profile 710 in FIG. 7A is input to an analysis model trained as illustrated in previous embodiments. The analysis model may compare the erosion profile 710 with a reference erosion profile 720 obtained through the machine learning process based on the historical erosion profiles. As the erosion profile 710 matches the reference erosion profile 720, the analysis model may determine that the erosion profile 710 is normal, and accordingly determine that the thin-film deposition process is normal. On the other hand, an erosion profile 730 derived under different deposition conditions is input to the analysis model and the analysis model may compare the erosion profile 730 with the reference erosion profile 720. As the erosion profile 730 does not match the reference erosion profile 720 on the peak 732, the analysis model may determine that the erosion profile 730 is abnormal, and accordingly determine that the thin-film deposition process is abnormal.

Figure 8A:
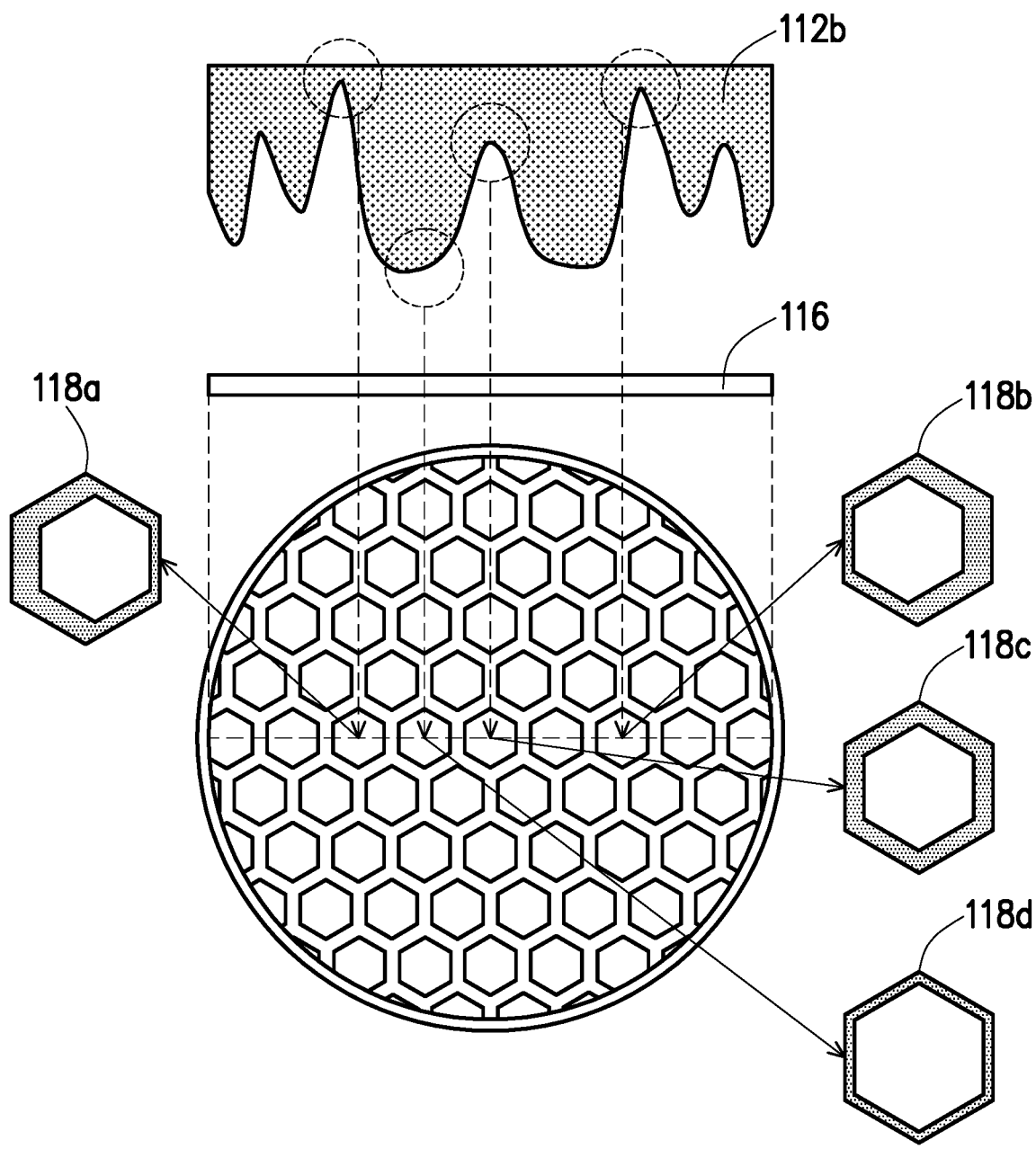
FIG. 8A and FIG. 8B are schematic diagrams illustrating the relation between a dimension of the collimator and the erosion profile of the target according to one embodiment.
Figure 8B:
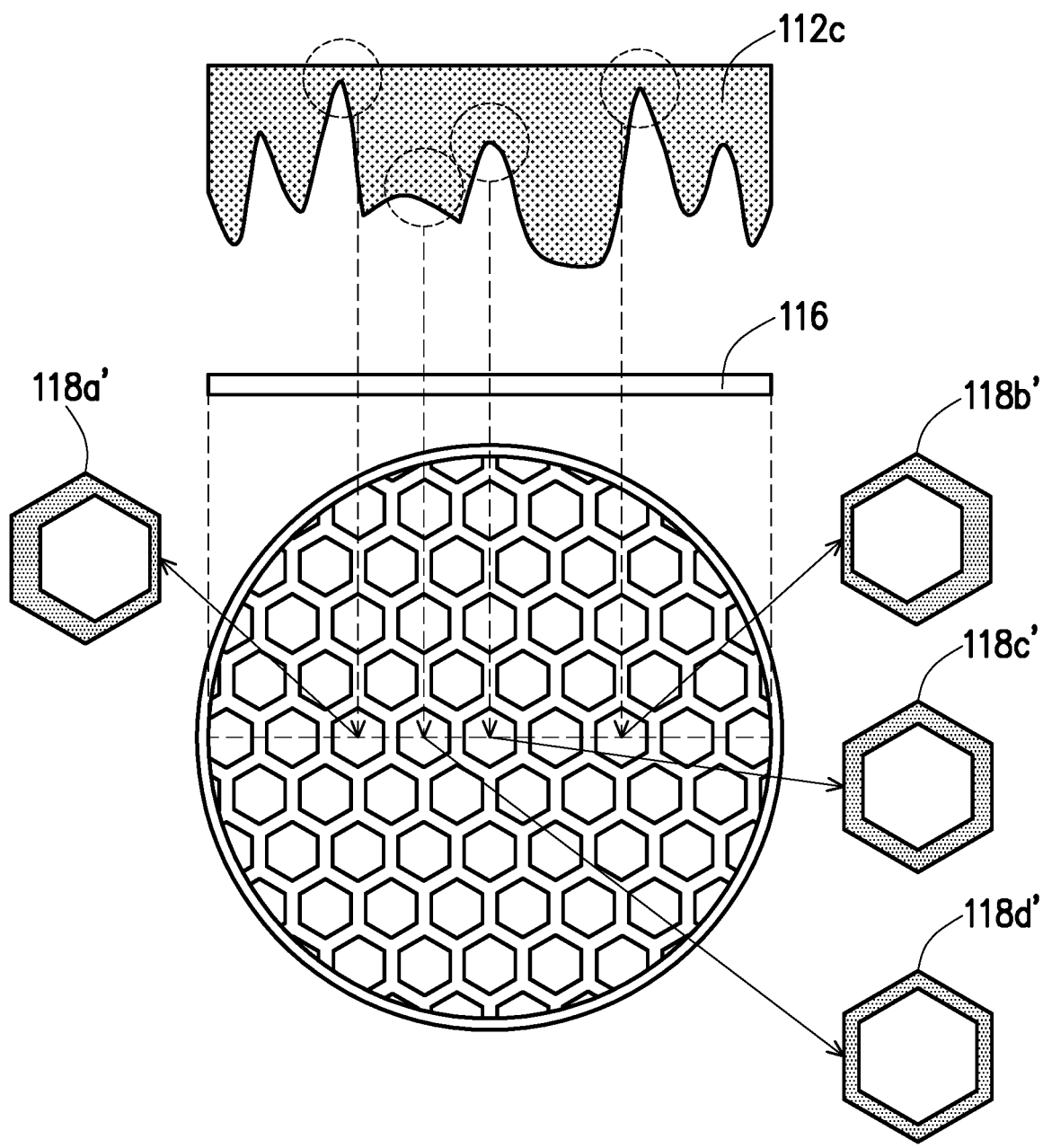

FIG. 8A and FIG. 8B are schematic diagrams illustrating the relation between a dimension of the collimator and the erosion profile of the target according to one embodiment. In FIG. 8A, an erosion profile of a target reminder 112b that is determined as normal is provided and four sections on the erosion profile of the target reminder 112b are directed to the corresponding comb structures 118a to 118d of the collimator 116, respectively. As shown in FIG. 8A, the dimensions (including a diameter of the opening and an asymmetry of the wall thickness) of the comb structures 118a to 118d may reflect the changes on the erosion profile of the target reminder 112b. The wall thicknesses in an outer side and an inner side of the side comb structures 118a and 118b are asymmetric due to a shielding effect occurred at wafer edges in a PVD process. In FIG. 8B, an erosion profile of the target reminder 112c currently derived is provided, and four sections on the erosion profile of the target reminder 112c are directed to the corresponding comb structures 118a' to 118d' of the collimator 116, respectively. Similar to FIG. 8A, the dimensions of the comb structures 118a' to 118d' in FIG. 8B may reflect the changes on the erosion profile of the target reminder 112c. However, by comparing FIGS. 8A and 8B, it can be found that the wall thickness of the comb structure 118d' in FIG. 8B is slightly larger than the wall thickness of the comb structure 118d in FIG. 8A, and such a difference may reflect on the corresponding section on erosion profile of the target reminder 112c. Accordingly, as the analysis model is trained with a large number of normal erosion profiles such as the erosion profile of the target reminder 112b in FIG. 8A, the analysis model may determine the thin-film deposition process is abnormal by analyzing the erosion profile of the target reminder 112c currently derived.

In accordance with some embodiments, a method for detecting abnormality of a thin-film deposition process is provided. The method comprises following steps: depositing a thin-film on a substrate in a thin-film deposition chamber by using a target; scanning a dimension of a collimator mounted between the target and the substrate by using at least one sensor disposed in the thin-film deposition chamber to derive an erosion profile of the target; and detecting abnormality of the thin-film deposition process by analyzing the erosion profile with an analysis model trained with data of a plurality of erosion profiles derived under a plurality of deposition conditions.

In accordance with some embodiments, a system for detecting abnormality of a thin-film deposition process is provided. The system comprises at least one sensor and a controller. The at least one sensor is disposed in a thin-film deposition chamber which deposits a thin-film on a substrate by using a target. The controller is coupled to the at least one sensor and configured to control the at least one sensor to scan a dimension of a collimator mounted between the target and the substrate to derive an erosion profile of the target after the thin-film deposition process, and detect abnormality of the thin-film deposition process by analyzing the erosion profile with an analysis model trained with data of a plurality of erosion profiles derived under a plurality of deposition conditions.

In accordance with some embodiments, a thin-film deposition system including a thin-film deposition chamber, at least one sensor and a control system is provided. The thin-film deposition chamber is configured to perform a thin-film deposition process. The at least one sensor is disposed in the thin-film deposition chamber. The control system is coupled to the thin-film deposition chamber and the at least one sensor, and configured to control the thin-film deposition chamber to deposit a thin-film on a substrate by using a target, control the at least one sensor to scan a dimension of a collimator mounted between the target and the substrate to derive an erosion profile of the target, and detect abnormality of the thin-film deposition process by analyzing the erosion profile with an analysis model trained with data of a plurality of erosion profiles derived under a plurality of deposition conditions.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A system for detecting abnormality of a thin-film deposition process, comprising:
at least one sensor disposed in a thin-film deposition chamber which deposits a thin-film on a substrate by using a target; and
a controller, coupled to the at least one sensor and configured to:
control the at least one sensor to scan a dimension of each of a plurality of comb structures of a collimator mounted between the target and the substrate to derive an erosion profile of the target according to a change on the dimension of each of the plurality of comb structures after the thin-film deposition process;
detect abnormality of the thin-film deposition process by analyzing the erosion profile with an analysis model trained with data of a plurality of erosion profiles derived based on the dimension of each of the plurality of comb structures scanned under a plurality of deposition conditions comprising material and lifetime of the target, and a magnetic field and an electric field applied during the thin-film deposition process; and
stop the thin-film deposition process when the abnormality is detected.

2. The system of claim 1, wherein the controller comprises raising an alert indicating the abnormality of the thin-film deposition process.

3. The system of claim 1, wherein the controller comprises controlling the at least one sensor disposed on a wall of the thin-film deposition chamber around the collimator to rotate around the collimator to scan the dimension of the collimator.

4. The system of claim 1, wherein the controller comprises controlling a robot carrying the at least one sensor to extend above the collimator and scan the dimension of the collimator.

5. The system of claim 1, wherein the deposition conditions comprise labels indicating normality or the abnormality of the thin-film deposition process, or labels indicating causes of the abnormality determined after the thin-film deposition process.

6. The system of claim 1, wherein the at least one sensor comprises a Lidar sensor or a Sonar sensor, and the controller comprises controlling the at least one sensor to emit a plurality of signal pulses to the collimator at regular intervals and detect a plurality of reflected signal from the collimator as the erosion profile of the target.

7. The system of claim 1, wherein the at least one sensor comprises an image sensor, and the controller comprises controlling the at least one sensor to capture an image of the plurality of comb structures of the collimator and identify a plurality of features in the captured image as the erosion profile of the target.

8. The system of claim 7, wherein the plurality of features comprise a diameter and asymmetry of each of the plurality of comb structures of the collimator.

9. A thin-film deposition system, comprising:
a thin-film deposition chamber, configured to perform a thin-film deposition process;
at least one sensor, disposed in the thin-film deposition chamber; and
a control system, coupled to the thin-film deposition chamber and the at least one sensor, and configured to:
control the thin-film deposition chamber to deposit a thin-film on a substrate by using a target;
control the at least one sensor to scan a dimension of each of a plurality of comb structures of a collimator mounted between the target and the substrate to derive an erosion profile of the target according to a change on the dimension of each of the plurality of comb structures; and
detect abnormality of the thin-film deposition process by analyzing the erosion profile with an analysis model trained with data of a plurality of erosion profiles derived based on the dimension of each of the plurality of comb structures scanned under a plurality of deposition conditions comprising material and lifetime of the target, and a magnetic field and an electric field applied during the thin-film deposition process; and
stop the thin-film deposition process when the abnormality is detected.

10. The thin-film deposition system of claim 9, wherein the at least one sensor comprises two sensors disposed on opposite walls of the thin-film deposition chamber around the collimator, and the controller comprises controlling the two sensors to rotate around the collimator to scan the dimension of the collimator.

11. The thin-film deposition system of claim 9, further comprising:
a robot, configure to extend above the collimator and carry the at least one sensor to scan the dimension of the collimator.

12. The thin-film deposition system of claim 9, wherein the at least one sensor comprises a light detection and ranging sensor, or a sound navigation and ranging sensor.

13. The thin-film deposition system of claim 9, wherein the control system is configured to control the at least one sensor to emit a plurality of signal pulses to the collimator at regular intervals and detect a plurality of reflected signal from the collimator as the erosion profile of the target.

14. The thin-film deposition system of claim 9, wherein the dimension of each of the plurality of comb structures comprise a diameter and asymmetry of each of the plurality of comb structures of the collimator.

15. The thin-film deposition system of claim 9, wherein the deposition conditions comprise labels indicating normality or the abnormality of the thin-film deposition process, or labels indicating causes of the abnormality determined after the thin-film deposition process.

16. A thin-film deposition system, comprising:
a thin-film deposition chamber, configured to perform a thin-film deposition process;
an image sensor, disposed in the thin-film deposition chamber; and
a control system, coupled to the thin-film deposition chamber and the image sensor, and configured to:

control the thin-film deposition chamber to deposit a thin-film on a substrate by using a target;

control the image sensor to capturing an image of a plurality of comb structures of a collimator mounted between the target and the substrate and identifying a plurality of features in the captured image as an erosion profile of the target; and detect abnormality of the thin-film deposition process by analyzing the erosion profile with an analysis model trained with data of a plurality of erosion profiles derived based on the plurality of features identified in the images captured under a plurality of deposition conditions comprising material and lifetime of the target, and a magnetic field and an electric field applied during the thin-film deposition process; and stop the thin-film deposition process when the abnormality is detected.

17. The thin-film deposition system of claim 16, further comprising:

a robot, configure to extend above the collimator and carry the image sensor to capture the image of each of the plurality of comb structures of the collimator.

18. The thin-film deposition system of claim 16, wherein the control system is configured to control the image sensor disposed on a wall of the thin-film deposition chamber around the collimator to rotate around the collimator to capture the image of the plurality of comb structures of the collimator.

19. The thin-film deposition system of claim 16, wherein the plurality of features comprise a diameter and asymmetry of each of the plurality of comb structures of the collimator.

20. The thin-film deposition system of claim 16, wherein the deposition conditions comprise labels indicating normality or the abnormality of the thin-film deposition process, or labels indicating causes of the abnormality determined after the thin-film deposition process.

* * * * *